(12) United States Patent
Ishizuka

(10) Patent No.: US 11,877,128 B2
(45) Date of Patent: Jan. 16, 2024

(54) AUDIO SIGNAL PROCESSING METHOD, APPARATUS, AND PROGRAM

(71) Applicant: YAMAHA CORPORATION, Hamamatsu (JP)

(72) Inventor: Kenji Ishizuka, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 114 days.

(21) Appl. No.: 17/478,250

(22) Filed: Sep. 17, 2021

(65) Prior Publication Data
US 2022/0007124 A1 Jan. 6, 2022

Related U.S. Application Data

(63) Continuation of application No. PCT/JP2020/005480, filed on Feb. 13, 2020.

(30) Foreign Application Priority Data

Mar. 20, 2019 (JP) ................................ 2019-052733

(51) Int. Cl.
*H04R 29/00* (2006.01)
*G10L 25/51* (2013.01)

(52) U.S. Cl.
CPC ............ *H04R 29/008* (2013.01); *G10L 25/51* (2013.01)

(58) Field of Classification Search
CPC ..... H04M 2215/7846; H04M 2250/64; H04M 1/656; H04M 2203/105; H04M 2207/18; H04M 3/493; H04M 7/0036; G10L 21/0232; G10L 25/06; G10L 25/60; G10L 25/21; G10L 25/51; H04R 2227/005;
(Continued)

(56) References Cited

U.S. PATENT DOCUMENTS 4,535,473 A 8/1985 Sakata
8,401,683 B2 * 3/2013 Maxwell ................. G10H 1/40
700/94

(Continued)

FOREIGN PATENT DOCUMENTS

CN 101154378 A 4/2008
CN 103916097 A 7/2014
(Continued)

OTHER PUBLICATIONS

English translation of Written Opinion issued in Intl. Appln. No. PCT/JP2020/005480 dated May 12, 2020, previously cited in IDS filed Sep. 17, 2021.
(Continued)

*Primary Examiner* — Lun-See Lao
(74) *Attorney, Agent, or Firm* — ROSSI, KIMMS & McDOWELL LLP

(57) ABSTRACT

An appropriate level index is obtained from an input audio waveform. An audio signal processing method includes detecting one or more level values in each of a plurality of attack sections included in an audio signal including the plurality of attack sections and a plurality of non-attack sections different from the plurality of attack sections; and generating a histogram of the detected level values in each of the plurality of attack sections, the generated histogram excluding level values of the plurality of non-attack sections.

20 Claims, 9 Drawing Sheets

(58) Field of Classification Search
CPC ...... H04R 25/356; H04R 27/00; H04R 3/002; H04R 2201/028; H04R 2430/01; H04R 29/008; G10H 1/0008; G10H 1/40; G10H 1/46; G10H 2210/051
USPC ........................................ 381/56–58; 700/94
See application file for complete search history.

(56) References Cited

U.S. PATENT DOCUMENTS

| | | |
|---|---|---|
| 2002/0021759 A1 | 2/2002 | Abe et al. |
| 2005/0234366 A1 | 10/2005 | Heinz |
| 2008/0202320 A1 | 8/2008 | Skowronek |
| 2011/0176685 A1* | 7/2011 | Elmedyb .............. H04R 25/453 381/23.1 |
| 2012/0155659 A1* | 6/2012 | Crockett ................ H03G 9/005 381/57 |
| 2013/0060367 A1* | 3/2013 | Disch .................... G10L 21/038 700/94 |
| 2016/0027339 A1 | 1/2016 | Kent |
| 2021/0132895 A1* | 5/2021 | Cengarle ................ G10L 25/06 |

FOREIGN PATENT DOCUMENTS

| | | |
|---|---|---|
| CN | 104885153 A | 9/2015 |
| CN | 106155640 A | 11/2016 |
| JP | H11175097 A | 7/1999 |
| JP | 2001222289 A | 8/2001 |
| JP | 2008542835 A | 11/2008 |
| JP | 2010251937 A | 11/2010 |
| JP | 2015200685 A | 11/2015 |
| JP | 2016109620 A | 6/2016 |
| JP | 2016152509 A | 8/2016 |
| JP | 2016177176 A | 10/2016 |
| JP | 2016184112 A | 10/2016 |
| JP | 2016536919 A | 11/2016 |

OTHER PUBLICATIONS

International Preliminary Report on Patentability issued in Intl. Appln. No. PCT/JP2020/005480 dated Sep. 30, 2021. English translation provided.
Office Action issued in Japanese Appin. No. 2019-052733 dated Jan. 17, 2023. English machine translation provided.
International Search Report issued in Intl. Appln. No. PCT/JP2020/005480 dated May 12, 2020. English translation provided.
Written Opinion issued in Intl. Appln. No. PCT/JP2020/005480 dated May 12, 2020.
"Loudness Maximizer" <URL: http://help.izotope.com/docs/ozone4/pages/modules_loudness_maximizer.htm> Retrieved Jan. 8, 2019. Cited in Specification.
Bello. "A Tutorial on Onset Detection in Musical Signals." IEEE Transactions on Speech and Audio Processing. 2005: 1035-1047. vol. 13, Issue 5. Cited in Specification.
Extended European Search Report issued in European Appln. No. 20773993.9 dated Nov. 3, 2022.
Lykartsis. "Evaluation of Accent-Based Rhythmic Descriptors for Genre Classification of Musical Signals". Technische Universitat Berlin, Fachgebiet Audiokommunikation. Apr. 16, 2014: 139 pages.
Office Action issued in Chinese Appln. No. 202080021190.9 dated Nov. 1, 2023. English translation provided.

* cited by examiner

AUDIO SIGNAL PROCESSING METHOD, APPARATUS, AND PROGRAM

CROSS REFERENCE TO RELATED APPLICATIONS

The present application is a continuation application of International Application No. PCT/JP2020/005480, filed Feb. 13, 2020, which claims priority to Japanese Patent Application No. 2019-052733, filed Mar. 20, 2019. The contents of these applications are incorporated herein by reference in their entirety.

BACKGROUND

The present invention relates to audio signal processing, and is particularly related to a method for generating information that is an index of an input level of an audio signal.

In order to appropriately perform input level control or dynamics control in audio signal processing, signal processing parameters need to be set to values appropriate for an input level. In the technology disclosed in Non-Patent Literature 1, a histogram of instantaneous sample values in all sections of an input sound waveform is provided to a user as an input level index.

CITATION LIST

Non-Patent Literature 1: Loudness Maximizer, [searched for on Jan. 8, 2019], Internet, <URL:http://help.izotope.com/docs/ozone4/pages/modules_loudness_maximizer.htm>

Non-Patent Literature 2: A Tutorial on Onset Detection in Musical Signals, IEEE Transactions on Speech and Audio Processing (Volume: 13, Issue: 5), Aug. 15, 2005 publication

SUMMARY

However, the instantaneous sample values of all sections of an input audio signal also include, for example, instantaneous sample values from a section where sound is attenuated and a section where no musical instrument is being played. Thus, the histogram obtained therefrom fails to be a suitable signal level index for input level or dynamics control.

The present invention was realized in light of the above circumstances, and it is an object thereof to provide a method for obtaining an appropriate signal level index from an input audio signal.

The present invention provides an audio signal processing method of detecting one or more level values in each of a plurality of rising part of a waveform of each musical note included in an audio signal, and creating a histogram of the detected level values. The audio signal includes a plurality of attack sections and a plurality of non-attack sections different from the plurality of attack sections.

DETAILED DESCRIPTION

Hereinafter, embodiments of the present invention will be described in with reference to the drawings.

Functional Configuration Shared by Embodiments

Figure 1:
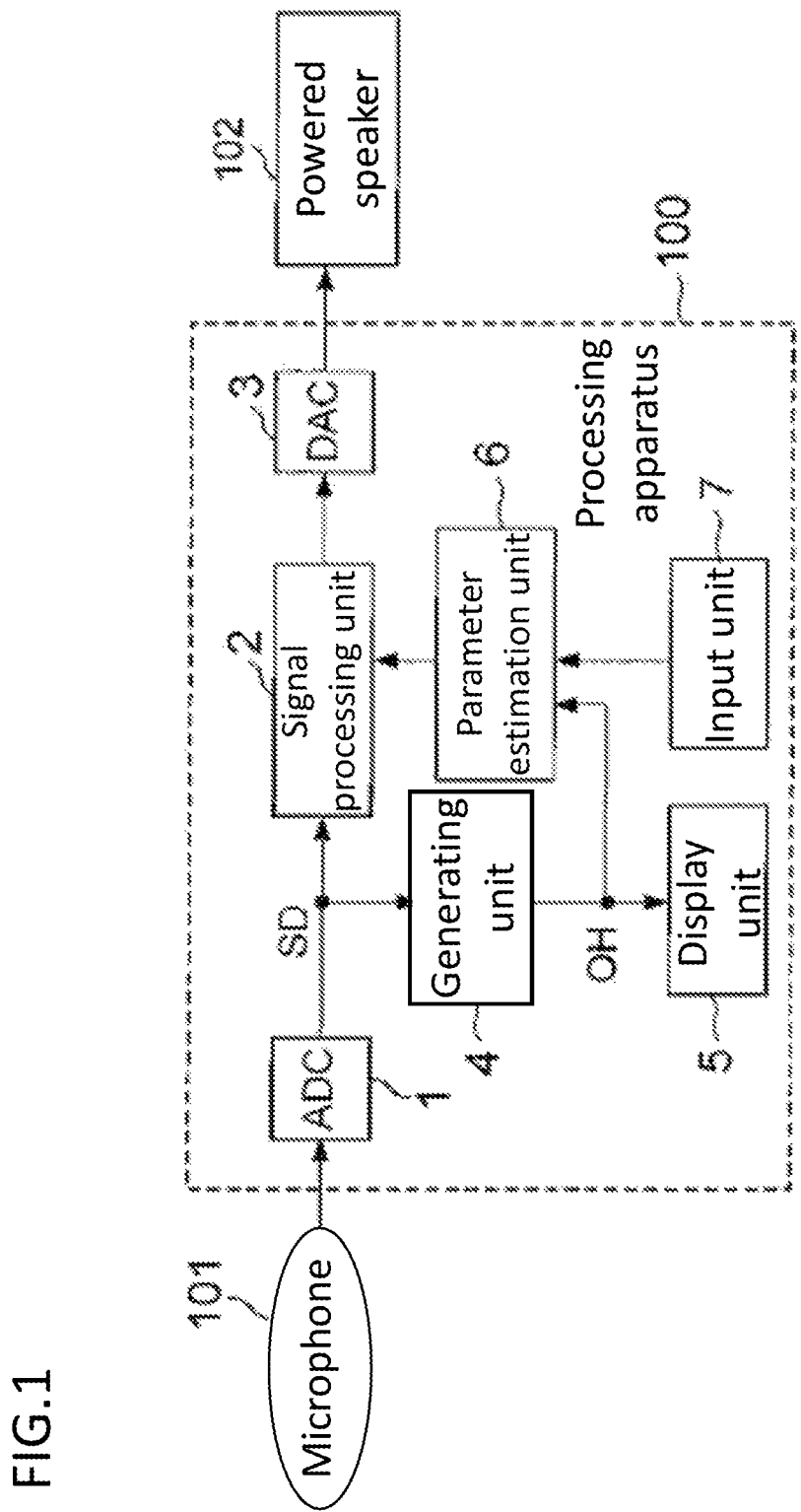
FIG. 1 is a block diagram showing a configuration of an audio signal processing apparatus shared by a plurality of embodiments of the present invention.

FIG. 1 shows a functional configuration of a later-described audio signal processing apparatus 100 shared by a first embodiment and other embodiments of the present invention described below. Here, a microphone 101 that supplies an audio signal to the processing apparatus 100 and a powered speaker 102 that outputs an audio signal output from the processing apparatus 100 as sound are shown together with the processing apparatus 100. The processing apparatus 100 may be any one of an audio mixer, a signal processing engine, a karaoke apparatus, an electronic musical instrument, a video camera, a tablet terminal, a smart phone, or the like.

The audio signal processing apparatus 100 includes an ADC (Analog Digital Converter) 1, a signal processing unit 2, a DAC (Digital Analog Converter) 3, an onset histogram generating unit 4, a display unit 5, a parameter estimation unit 6, and an input unit 7.

The ADC 1 performs A/D conversion on an analog audio signal supplied from the microphone 101, and outputs the converted signal as a digital signal SD. The signal processing unit 2 performs signal processing for, for example, input level or dynamics control on the signal SD and outputs the processed signal. The DAC 3 performs D/A conversion on the digital audio signal output from the signal processing unit 2, and outputs the converted signal to the powered speaker 102 as an analog signal.

Figure 2:
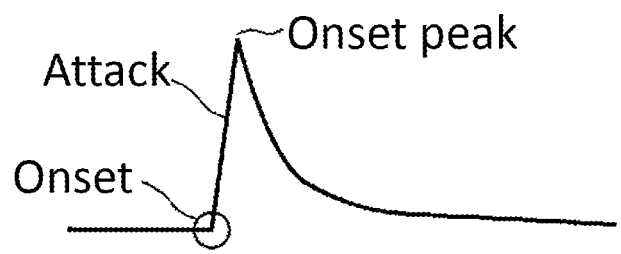
FIG. 2 is a diagram illustrating an onset and an onset peak in the present invention.

The onset histogram generating unit 4 is an apparatus that detects one or more levels of a rising part of a waveform starting from an onset of the signal SD, and makes a histogram thereof. Here, "onset" refers to a rising point of a waveform of each musical note included in an input audio signal. According to Non-Patent Literature 2, the onset is, for example, an attack initiation point where a waveform envelope increases, as shown in FIG. 2. Note that FIG. 2 schematically shows an envelope of an audio signal, and depending on the audio signal waveform, there are cases where a plurality of peaks occur in an attack section. The generating unit 4 shown in FIG. 1 detects one or more onsets in a signal SD, detects a peak appearing in an attack section starting from each onset as an onset peak, and generates a histogram of the onset peaks.

The onset histogram is displayed by the display unit 5. Based on the displayed onset histogram, a user determines a parameter to be used by the signal processing unit 2, and inputs the determined parameter using the input unit 7. The parameter estimation unit 6 adjusts a parameter for audio signal processing in response to the parameter input by the user being set in the signal processing unit 2. In other words, the parameter estimation unit 6 adjusts the parameter for audio signal processing in response to a user operation received after the onset histogram is displayed on the display device. "Parameter" here is, for example, a threshold value of a dynamics circuit in a compressor or the like, an input gain of a channel, a threshold value of a dynamic equalizer, a fader level used when the signal processing unit 2 receives input of signals SD from a plurality of channels and mixes the signals SD, and the like. As another example, the parameter estimation unit 6 may also include an AI (Artificial Intelligence) function. The parameter estimation unit 6 is provided with AI that has learnt a correspondence between an onset histogram of an audio signal and the parameter appropriate for the signal in advance, determines the parameter appropriate for the signal according to the onset histogram of the input audio signal, and as a result of the determined parameter being set to the signal processing unit 2, adjusts a parameter for audio signal processing. AI here can be realized by a learning model that receives input of an onset histogram and outputs a parameter, for example. Also, examples of the learning model here include neural networks such as CNN (Convolutional Neural Network) and RNN (Recurrent Neural Network), as well as machine learning models including regression analysis, decision trees, SVM (Support Vector Machine), and HMM (Hidden Markov Model). Also, the learning model here may be configured to further receive input of the timbre (type of musical instrument etc.) of a signal SD in addition to an onset histogram. Information regarding the timbre of the signal SD input to the learning model may be input by a user, and may also be automatically estimated from the signal SD by the parameter estimation unit 6. In this case, if, for example, the signal processing unit 2 is a mixer, a parameter can be determined at the time of mixing while giving consideration to the timbres of signals SD input to the signal processing unit 2 from a plurality of channels.

First Embodiment

Figure 3:
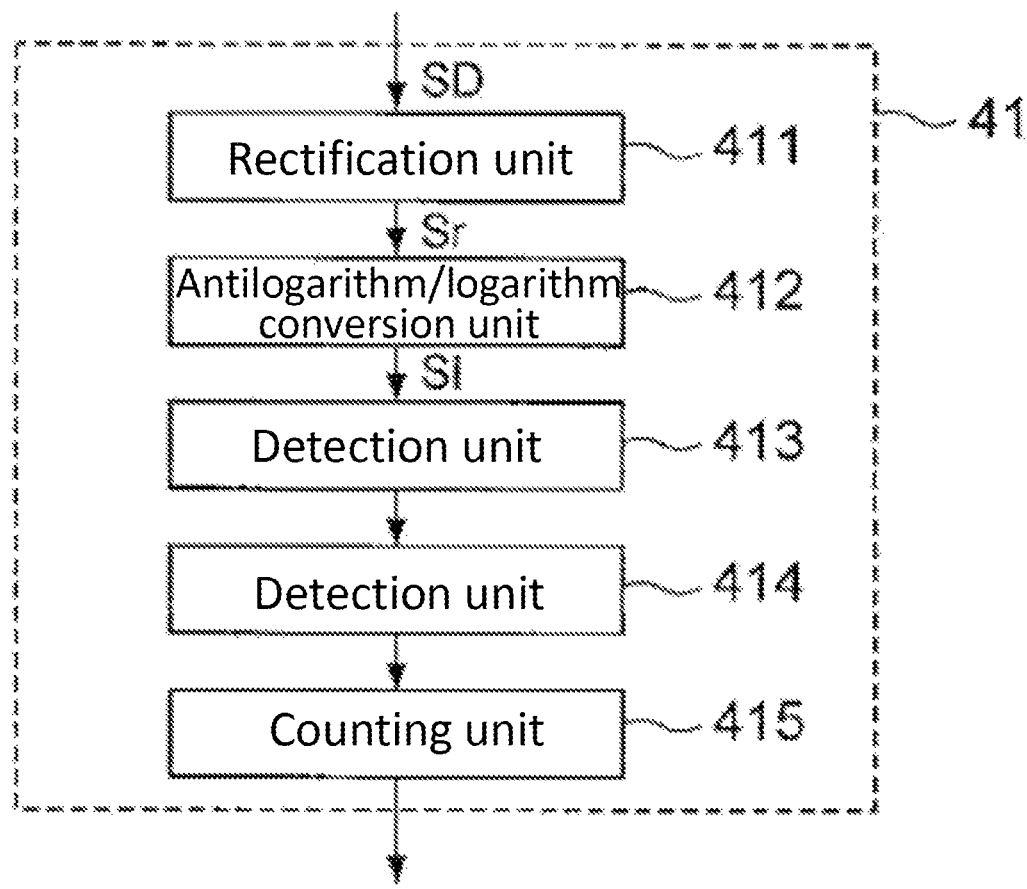
FIG. 3 is a block diagram showing an example configuration of an onset histogram generating unit according to a first embodiment of the present invention.

FIG. 3 shows, as an example of the generating unit 4, the configuration of an onset histogram generating unit 41 according to the first embodiment of the present invention. The generating unit 41 is provided with a rectification unit 411, an antilogarithm/logarithm conversion unit 412, a peak detection unit 413, an onset peak detection unit 414, and a frequency counting unit 415.

The rectification unit 411 performs full-wave rectification on the signal SD every sampling period and outputs a signal Sr. The antilogarithm/logarithm conversion unit 412 converts sample values of the signal Sr into logarithms, and outputs the logarithms as sample values SI.

The peak detection unit 413 splits the sample values SI into time frames of a certain time length corresponding to a predetermined number n of sampling periods, and obtains the sample value peak (maximum value) for each time frame.

The onset peak detection unit 414 detects onsets from the row of sample values SI, and detects onset peaks from the series of peaks detected by the detection unit 413 based on the onsets.

Note that the onset detection may be carried out according to any known method including the following methods disclosed in non-Patent Document 2.

Method 1: Obtain the envelope of the sample values SI, and set a timing at which the envelope sharply rises as an onset.

Method 2: Divide the sample values SI into frames of a certain time length, and calculate an STFT coefficient for each frame. Set a timing at which there is pronounced change in a high-frequency STFT coefficient as an onset.

Method 3: Divide the sample values SI into frames of a certain time length, calculate the STFT coefficient for each frame, and calculate phase information from the STFT coefficients. Set the timing at which there is pronounced change in the mode of change in phase information accompanying a frame transition as an onset.

Method 4: Divide the sample values SI into frames of a certain time length, and calculate a wavelet coefficient for each frame. Set a timing at which there is pronounced change in a wavelet coefficient accompanying frame transition as an onset.

Method 5: Treat the sample values SI as being generated from one of two models, namely a model A and a model B. Set a timing at which the magnitude relationship between a log likelihood that the sample values SI were generated from the model A and a log likelihood that the sample values SI were generated from the model B is reversed as an onset.

Method 6: Calculate a prediction difficulty of predicting current sample values SI from past sample values SI, and set a timing at which there is a pronounced increase in prediction difficulty as an onset.

The detection unit 414 may determine an onset peak using a method such as the following.

Figure 4:
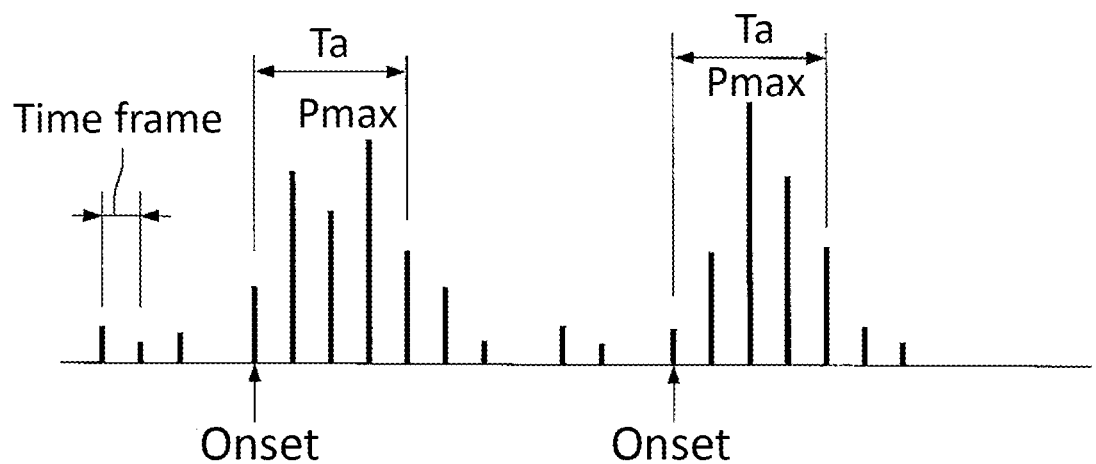
FIG. 4 is a waveform diagram showing an example of operations of the first embodiment.

Example 1: Specify a predetermined time period Ta (as long as a rise in a musical note; for example, several hundred milliseconds to approximately one second) starting from a detected onset as an attack section, as shown in FIG. 4, and set the maximum value Pmax in the attack section of the above series of peaks as an onset peak.

Example 2: Apply a smoothing filter to the above series of peaks to make a smooth curve, and set the maximum value in the attack section of the curve as an onset peak.

In FIG. 3, the frequency counting unit 415 divides the variable range of the onset peaks output by the detection unit 414 into a plurality of ranges, and generates an onset histogram by counting the frequency of onset peaks belonging to each range. An onset histogram generated in this way is displayed by the display unit 5 shown in FIG. 1, or alternatively, is supplied to the parameter estimation unit 6. The detection time range of onset peaks used to create the histogram may be set as appropriate. A histogram may be generated using onset peaks detected in any one of, for example, a time range of one or more songs, a time range of climaxes in a plurality of songs, an immediately prior predetermined time range, and a time range specified by the user. Namely, a histogram may be generated for a portion of the audio signal in an appropriate time range including the user-specified time section received by a later-described UI unit.

Here, the immediately prior predetermined time range is a range of a window of a duration specified by the user, the range being from a time reached by tracing back from the current time by the specified duration, to the current time. The generating unit 4 (counting unit 415) moves the window as time passes and generates an onset peak histogram based on an audio signal that enters the time range of the window. More specifically, every time an onset peak is detected, the frequency of the range to which the onset peak value belongs is increased (increased by one), and the onset peak value and the time at which it was detected are stored as a history. Then, when a predetermined time period has passed from the thus stored time, the onset peak values are read from the history, and the frequency of the ranges to which the values belong is reduced (reduced by one).

Alternatively, the user may specify the forgetting speed (attenuation factor) of the histogram instead of specifying the duration of the window. The generating unit 4 (counting unit 415) increases the frequency of each range every time an onset peak is detected, and reduces the frequency at a rate that corresponds to the forgetting speed every time a time period elapses.

Also, the time range specified by the user is a past time range spanning from a start time to an end time specified by the user. The onset peak histogram is not created in real time, but is created for an audio signal of the specified past time range. In this case, in order to obtain an onset peak of a past time range, an information storage unit, which is for storing some type of information regarding past audio signals, and is exemplified by a later-described recording unit of the third embodiment or a recorder of the fourth embodiment, is required.

According to this embodiment, the generated histgram is a histogram of onset peaks that occur in each of a plurality of attack sections of a certain time length starting from each onset and the generated histgram is excluding peaks that occur in non-attack sections, thus can be used as an appropriate index regarding the input level.

Second Embodiment

Figure 5:
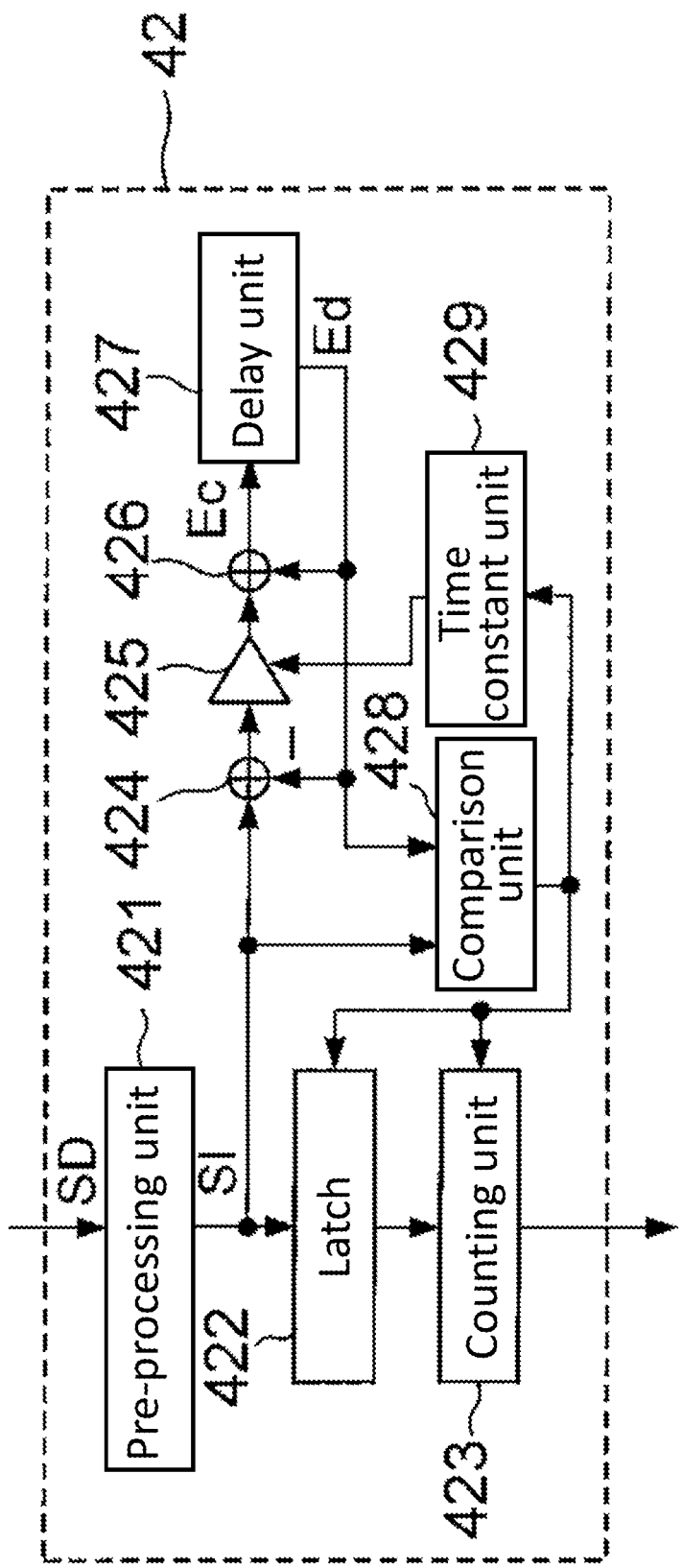
FIG. 5 is a block diagram showing an example configuration of an onset histogram generating unit according to a second embodiment of the present invention.

FIG. 5 shows, as an example of the generating unit 4, a configuration of an onset histogram generating unit 42, which is the second embodiment of the present invention.

In the generating unit 42, a pre-processing unit 421 performs full-wave rectification on a sample SD of an audio signal every sampling period, further converts the result into a logarithm, and outputs the logarithm as a sample SI.

A subtraction unit 424, a multiplication unit 425, an addition unit 426, a delay unit 427, a comparison unit 428, and a time constant unit 429 act as an envelope follower to generate an envelope Ed based on the samples SI output by the pre-processing unit 421 every sampling period.

More specifically, the subtraction unit 424 subtracts the current value of the envelope Ed from a sample SI, and outputs a sample indicating the subtraction result. The comparison unit 428 compares the sample SI and the current value of the envelope Ed, and outputs a signal indicating the comparison result. When the signal output by the comparison unit 428 indicates that the sample SI is larger than the current value of the envelope Ed, the time constant unit 429 outputs a coefficient al corresponding to a short time constant. On the other hand, when the signal output by the comparison unit 428 indicates that the sample SI is smaller than or equal to the current value of the envelope Ed, the time constant unit 429 outputs a coefficient $\alpha 2 < \alpha 1$ that corresponds to a long time constant. The multiplication unit 425 multiplies the sample output by the subtraction unit 424 by the coefficient output by the time constant unit 429 and outputs the result. The addition unit 426 adds the sample output by the multiplication unit 425 and the current value of the envelope Ed together, and outputs the result as a sample Ec. The delay unit 427 outputs a sample obtained by delaying the sample Ec by one sampling period as the current value of the envelope Ed. Note that the sign of the subtraction result of the subtraction unit 424 may be used in place of the output of the comparison unit 428, and the comparison unit 428 may be omitted.

With the above configuration, in the period in which the sample SI is larger than the current value of the envelope Ed, the envelope Ed sharply rises following a rise in the sample SI of the audio signal, at a first time constant corresponding to the coefficient $\alpha 1$. Also, in the period in which the sample SI is smaller than or equal to the current value of the envelope Ed, the envelope Ed gently falls at a second time constant, which corresponds to a coefficient $\alpha 2$ and is longer than the first time constant.

When a sample SI is larger than the current value of the envelope Ed in a certain sampling period, that is, when a signal output by the comparison unit 428 indicates that the audio signal is in a rising section, a latch 422 latches the sample SI at that point in time as a peak candidate Pc.

A frequency counting unit 423 is an apparatus that divides the variable range of the onset peaks into a plurality of ranges, and counts the frequency of onset peaks belonging to each range. The counting unit 423 resets all frequencies to zero following an instruction made by the user, and increases (adds one to) the frequency of the range to which the corresponding onset peak value belongs every time an onset peak is detected following the reset. More specifically, after a rising section has been determined in a certain sampling period and the peak candidate Pc has been latched by the latch 422, if the next peak candidate is not latched during a predetermined period T0 corresponding to a predetermined number m of sampling periods, at that point in time, the counting unit 423 determines the latched peak candidate Pc as the onset peak Po, and increases the frequency of the range to which the onset peak Po belongs. Each attack section in the second embodiment includes an intermission that is shorter than the predetermined period T0, and is a series of sampling periods determined as continuously being in a rising section. The lead sampling period in each attack section is deemed to be the onset timing corresponding to the attack section.

Figure 6:
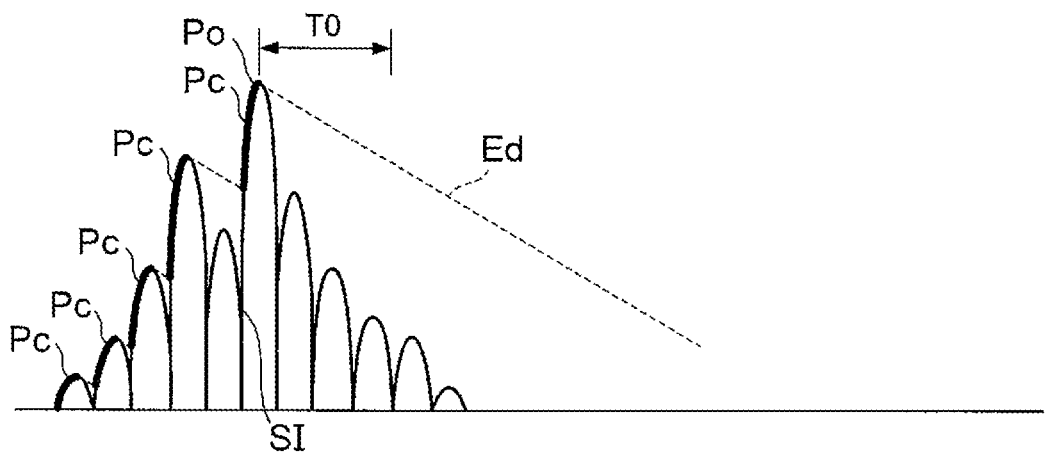
FIG. 6 is a waveform diagram showing an example of operations of the second embodiment.

FIG. 6 is a waveform diagram showing an example of operations performed by the generating unit 42. In FIG. 6, the sample SI in each sampling period in a rising section shown with a thick line is sequentially latched as a peak candidate Pc. After the sample SI is latched in the last sampling period in the fifth section from the left marked with a thick line, time T0 elapses without SI>Ed being satisfied. An attack section is established in the sampling period during which the time T0 elapses, the sample SI latched at that point in time is detected as the onset peak Po, and the frequency of the range to which the value thereof belongs is increased by one.

According to this embodiment, the peak values of the audio signal waveform in each of the plurality of attack sections excluding non-attack sections are detected as onset peaks, and an onset histogram that shows the distribution of onset peaks is generated. This histogram is a useful index for controlling signal processing parameters.

Also, according to this embodiment, a peak in an attack section in which an audio signal rises is set as an onset peak, and thus onset peaks can be adequately detected regardless of the length of the attack section.

Here, a histogram is generated using onset peaks in a time range spanning from a frequency reset instructed by the user to the current time, but the time range of onset peak detection can be set as necessary.

Variation of Second Embodiment

The following variation is conceivable for this embodiment.

In this variation, a histogram is generated with all samples of the rising sections shown with thick lines in FIG. 6, that is, all peak candidates Pc latched by the latch 422, treated as onset peaks. In general, an audio signal rises in a short period of time to its peak in an attack section, and thus a histogram created using this method takes a shape relatively close to a histogram created using only peaks in each of the plurality of attack sections as onset peaks, as in the first and second embodiments. In this variation, an onset peak histogram can be generated using samples in a shorter period and with a simpler configuration compared to the second embodiment.

Third Embodiment

Figure 7:
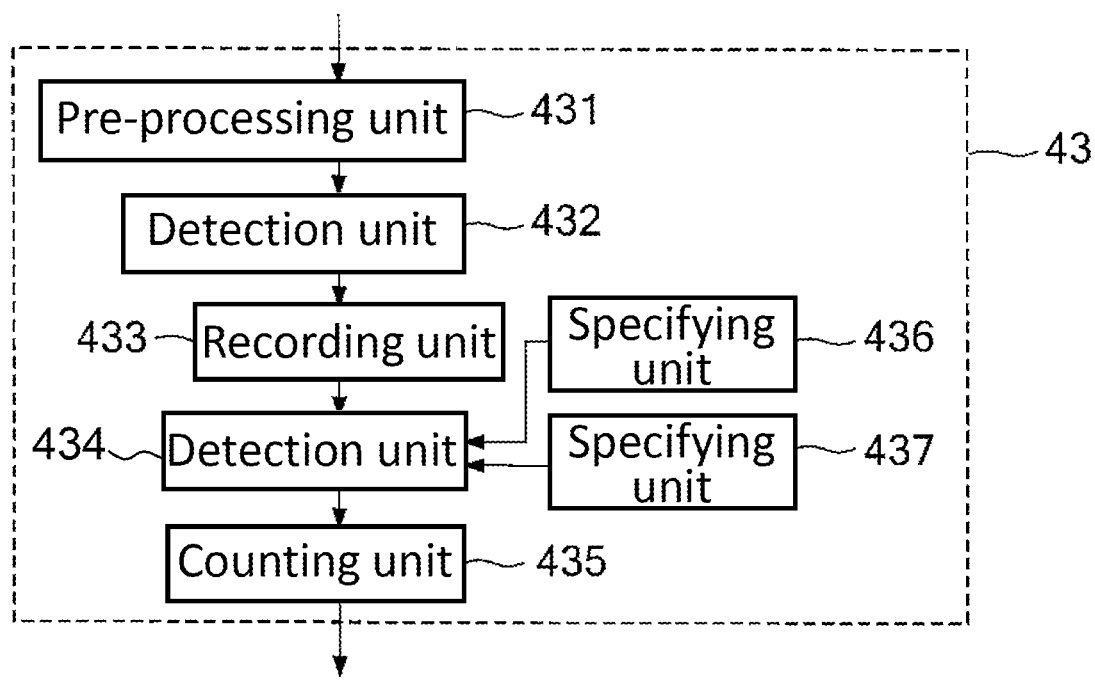
FIG. 7 is a block diagram showing an example configuration of an onset histogram generating unit according to a third embodiment of the present invention.

As an example of the generating unit 4, FIG. 7 shows a configuration of an onset histogram generating unit 43, which is the third embodiment of the present invention. A pre-processing unit 431 performs full-wave rectification on the signal SD every sampling period, converts the result to a logarithm, and outputs the logarithm as a sample SI. The pre-processing unit 431 also detects a series of onsets from the signal SD. A peak detection unit 432 detects a peak in each time frame from the sample SI output by the pre-processing unit 431, and records a time series of these peaks in a recording unit 433. The processing performed by the pre-processing unit 431, the detection unit 432, and the recording unit 433 is performed in the background while the processing apparatus 100 (for example, an audio mixer) performs processing (for example, performs mixing processing) on an audio signal.

An onset peak detection unit 434 selects, from the peak time series recorded in the recording unit 433, a peak time series in a time range specified by a detection range specifying unit 436, and detects an onset peak according to a detection condition specified by a detection condition specifying unit 437. Here, the user uses a later-described UI unit to specify a desired time range while looking at the time series of the peaks (the shape of the envelope waveform) displayed by a display device of the UI unit. Note that the onset peak detection method in this case is similar to that in the first embodiment. Also, the detection condition is, for example, a time length Ta of an attack period. A frequency counting unit 435 increases (adds one to) the frequency of the range to which the onset peak detected by the detection unit 434 belongs.

Similar effects to those of the above-described first embodiment can also be obtained in this embodiment. Also, with this embodiment, by using the peaks recorded in the recording unit 433 and specifying a time range, or alternatively, while changing the detection condition, onset peak detection or frequency counting can be executed.

Fourth Embodiment

Figure 8:
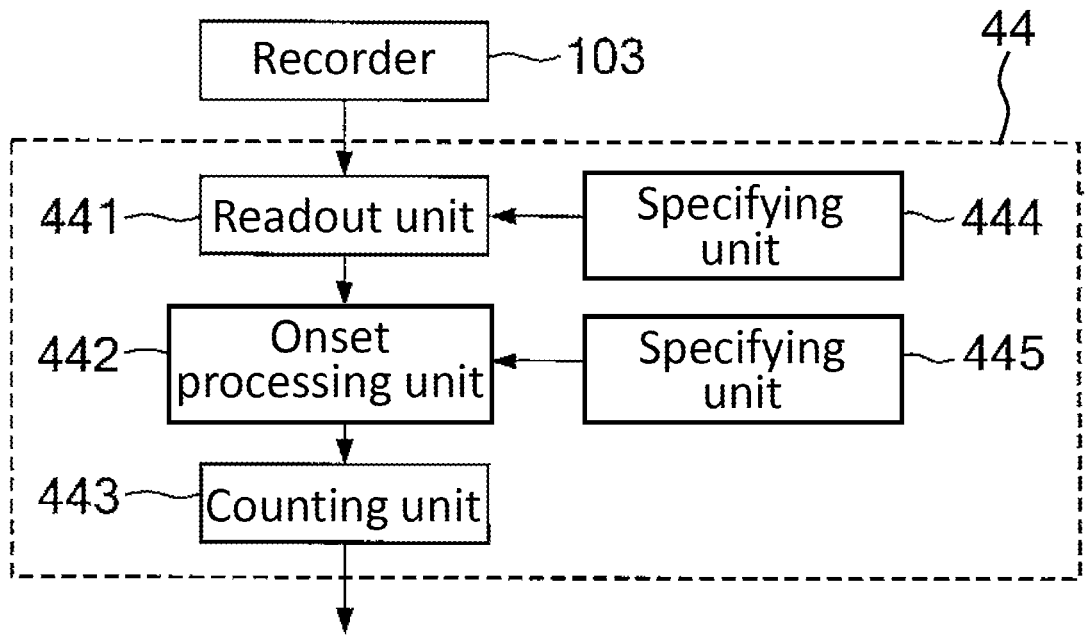
FIG. 8 is a block diagram showing an example configuration of an onset histogram generating unit according to a fourth embodiment of the present invention.

FIG. 8 is a block diagram showing a configuration of an onset histogram generating unit 44 according to the fourth embodiment of the present invention. The processing apparatus 100 in the fourth embodiment includes a multi-track recorder 103 (not shown) immediately after the ADC 1 shown in FIG. 1. While the processing apparatus 100 (for example, an audio mixer) performs processing (for example, mixing) on audio signals (audio signals of a plurality of channels) from the ADC 1, the recorder 103 stores the audio signals in a storage medium in the background. The generating unit 44 creates an onset histogram based on an audio signal (an audio signal of a desired channel) recorded on a recording medium of the recorder 103.

An onset processing unit 442 uses a similar method to that in the above-described first and second embodiment to detect onset peaks from an audio signal from a recorder.

A readout unit 441 reads a time series of samples SD of an audio signal in a time range specified by a detection range specifying unit 444 from the recording medium, and outputs the time series. The user uses a UI unit to specify a desired time range while looking at a time series of the samples SD (the shape of the audio waveform) displayed on a display device.

An onset processing unit 442 detects onset peaks from the audio signal output by the readout unit 441, according to a detection condition specified by a specifying unit 445. Any method described above may be used for this detection. A counting unit 443 generates a histogram of the detected onset peaks. The degree of freedom of the detection condition here is greater than that in the third embodiment, and an onset detection algorithm, an onset peak detection algorithm, and the like can also be specified.

Similar effects to those of the above-described first or second embodiment can also be obtained in this embodiment. Also, in this embodiment, by specifying a time range based on the recorded waveform recorded to the recording medium, or alternatively, while more freely changing the detection condition, onset peaks can be detected and a histogram can be generated.

Hard Configuration Shared by a Plurality of Embodiments

Figure 9:
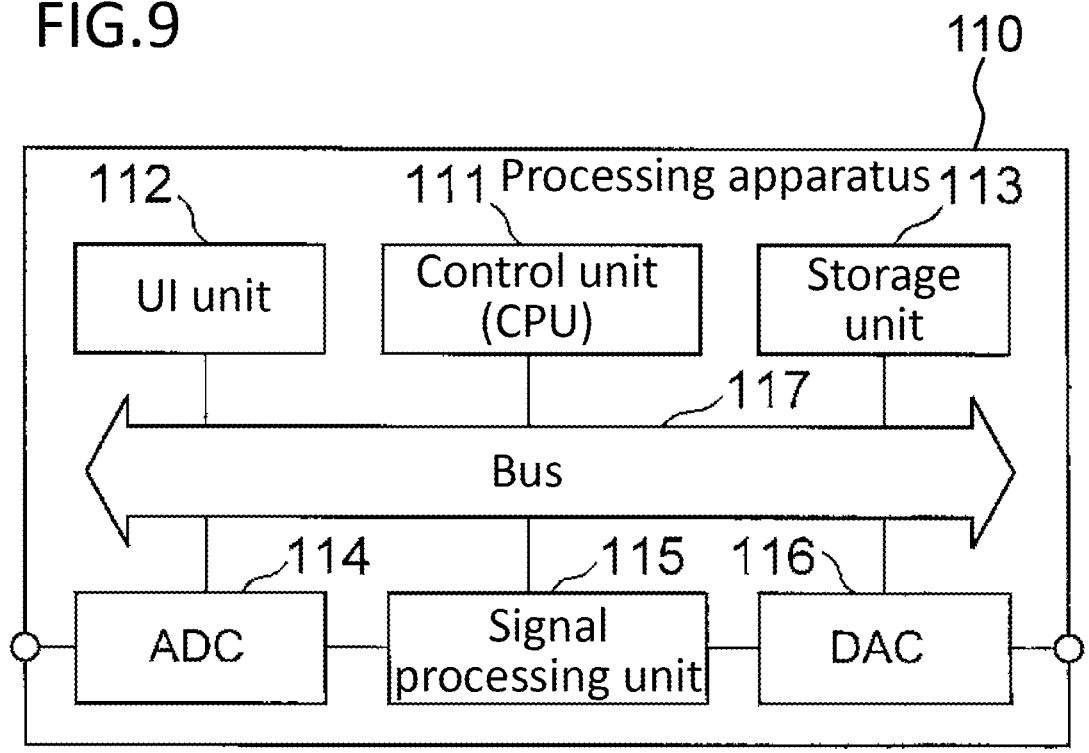
FIG. 9 is a block diagram showing a hardware configuration of an audio signal processing apparatus provided with an onset histogram generating unit according to the present invention.

FIG. 9 shows a configuration of the audio signal processing apparatus 100 shared by a plurality of embodiments of the present invention. The processing apparatus 100 includes a control unit 111, a UI (User Interface) unit 112, a storage unit 113, an ADC 114, a signal processing unit 115, a DAC 116, and a bus 117 that connects these elements.

The control unit 111 is a control circuit that controls the overall processing apparatus 100 and is constituted by one or more CPUs. The UI unit 112 includes an operation unit that receives an operation made by the user and supplies operation information corresponding to the received operation to the control unit 111, and a display unit that displays information received from the control unit 111. The storage unit 113 is a memory that stores various types of programs executed by the control unit 111 and various types of control information used to control the processing apparatus 100. The ADC 114 performs A/D conversion on an analog audio signal supplied from a microphone (not shown) or the like, and outputs the converted audio signal as a digital audio signal.

The signal processing unit 115 has two functions. The first function is a function of, under control by the control unit 111, creating an onset histogram based on a digital signal received from the ADC 114 or the like. That is, the control unit 111 executes a program stored in the storage unit 113 to cause the signal processing unit 115 to function as the generating unit 4 shown in FIG. 1.

The second function of the signal processing unit 115 is a function of, under control by the control unit 111, performing signal processing on a digital signal received from the ADC 114 or the like, and supplying the resulting digital signal to the DAC 116. That is, the control unit 111 causes the signal processing unit 115 to operate as the signal processing unit 2 showing in FIG. 1.

The DAC 116 performs D/A conversion on the digital signal output from the signal processing unit 115, and outputs the converted signal to a speaker 102 and the like not shown in FIG. 9.

Figure 10:
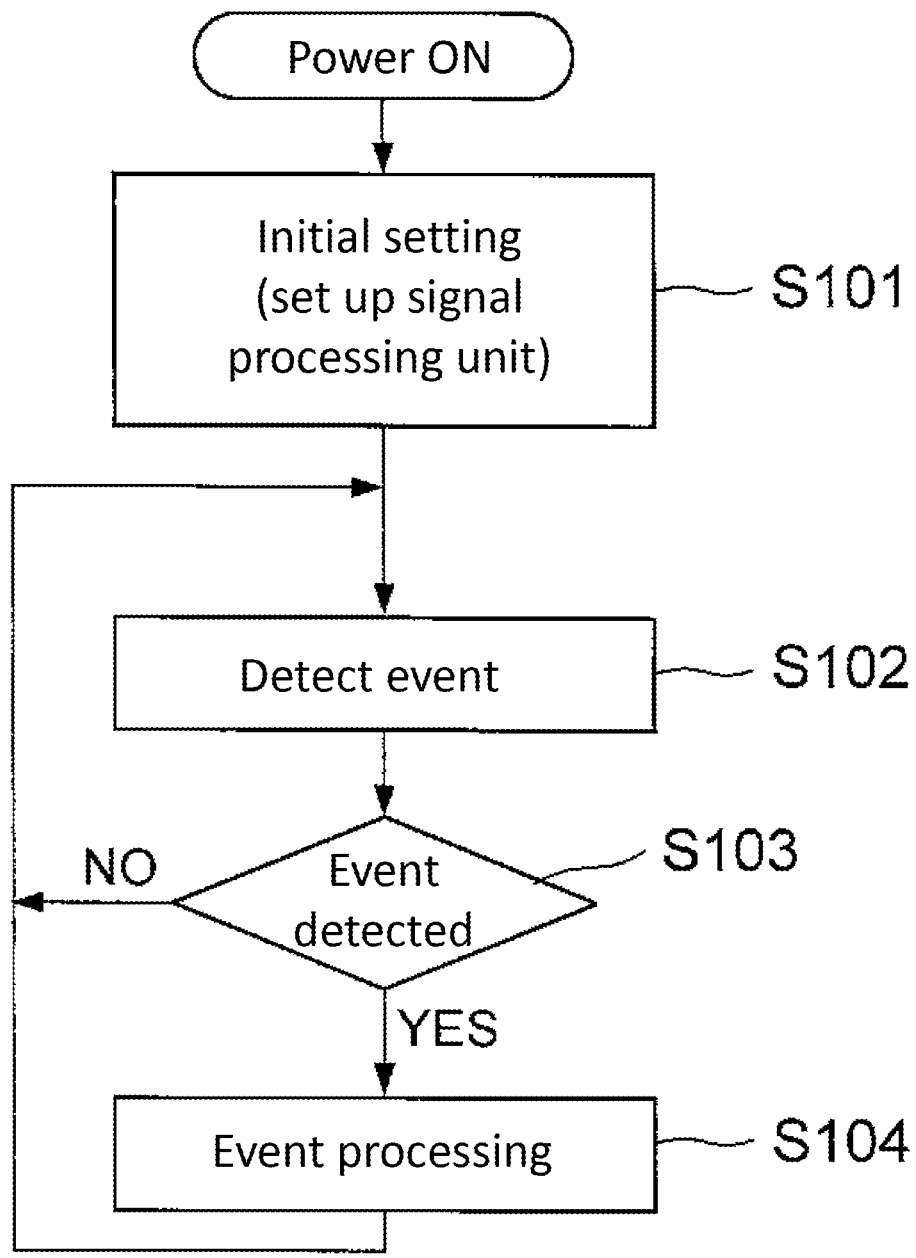
FIG. 10 is a flowchart showing operations performed by the processing apparatus shown in FIG. 9.

Next, operations of this embodiment will be described below. When the processing apparatus 100 is turned on, the control unit 111 executes the main routine stored in the storage unit 113. FIG. 10 is a flow chart of this main routine. First, the control unit 111 performs initial setting (step S101). In the initial setting, the control unit 111 reads a program for causing the signal processing unit 115 to function as the generating unit 4 and the signal processing unit 2, which are shown in FIG. 1, from the storage unit 113, and sets the program for the signal processing unit 115. Next, the control unit 111 detects the occurrence of various events (for example, a user operation performed on the UI unit 112) in the processing apparatus 100 (step S102). Then, the control unit 111 determines whether or not any type of event was detected in step S102 (step S103). If the determination result of step S103 is "NO", the control unit 111 repeats the event detection (step S102) and determination of whether or not an event occurred (step S103). If the determination result in step S103 is "YES", the control unit 111 executes event processing (step S104) that corresponds to the detected event, and then repeats the event detection (step S102) and determination of whether or not an event occurred (step S103) again.

In the event processing (step S104), processing that corresponds to the type of event detected in step S102 is executed. Regarding the first and second embodiments, for example, if a user operation instructing that the creation of an onset histogram be started is detected in step S103, the control unit 111 instructs the signal processing unit 115 to start creating an onset histogram. In response to this creation start instruction, the generating unit 4 of the signal processing unit 115 starts onset peak detection and onset histogram creation that is based on the digital audio signal supplied later by the ADC 114.

Figure 11:
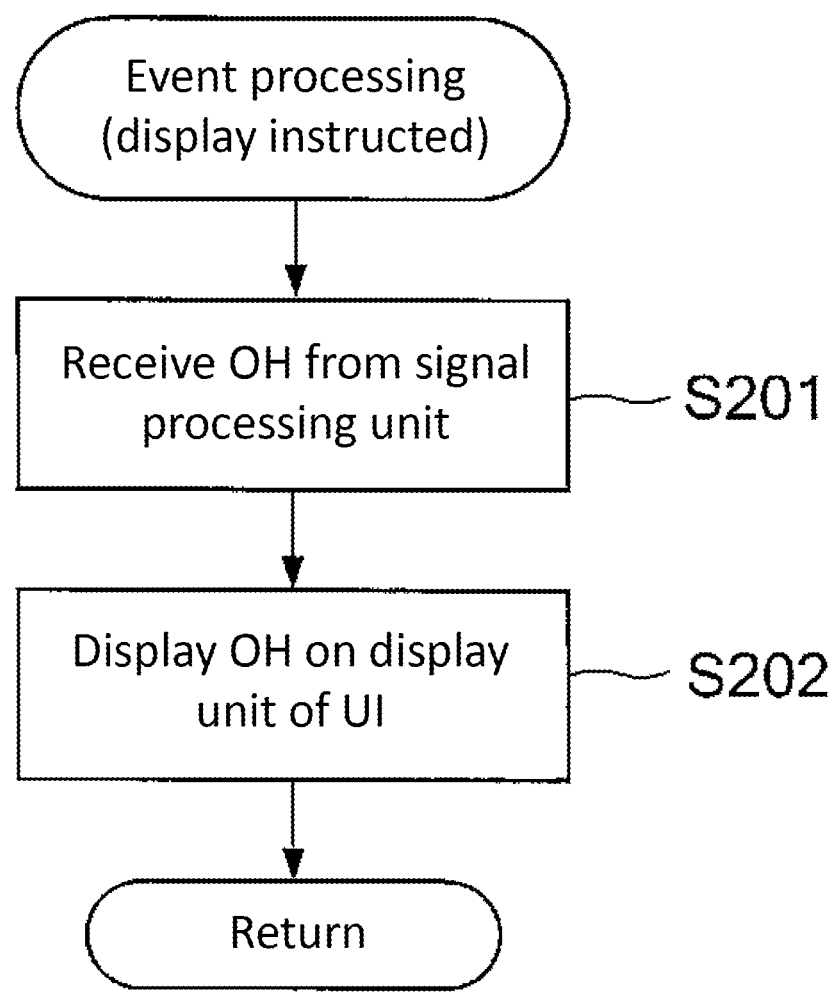
FIG. 11 is a flowchart showing operations performed by the processing apparatus shown in FIG. 9.

Also, if a user operation instructing display of an onset histogram is detected in step S103, the control unit 111 executes the event processing shown in FIG. 11 in response to the display instruction in step S104. The display instruction is an instruction for displaying a setting screen of a compressor or the like that includes an onset histogram graph display, on the display device of the UI unit 112.

First, the control unit 111 receives an onset histogram OH already created at this point in time from the generating unit 4 of the signal processing unit 115 (step S201). Next, the control unit 111 displays the onset histogram OH on the display device of the UI unit 112 (step S202). Then, this event processing is ended. The signal processing unit 115 may similarly be operated as the generating unit 43 and the generating unit 44 in the third and fourth embodiment as well.

Various variations can be considered regarding role sharing between the control unit 111 and the signal processing unit 115 in the processing apparatus 100. For example, some or all of the generation processing (generating unit 4) performed on the onset histogram OH may be executed by the control unit 111 instead of the signal processing unit 115.

Figure 12:
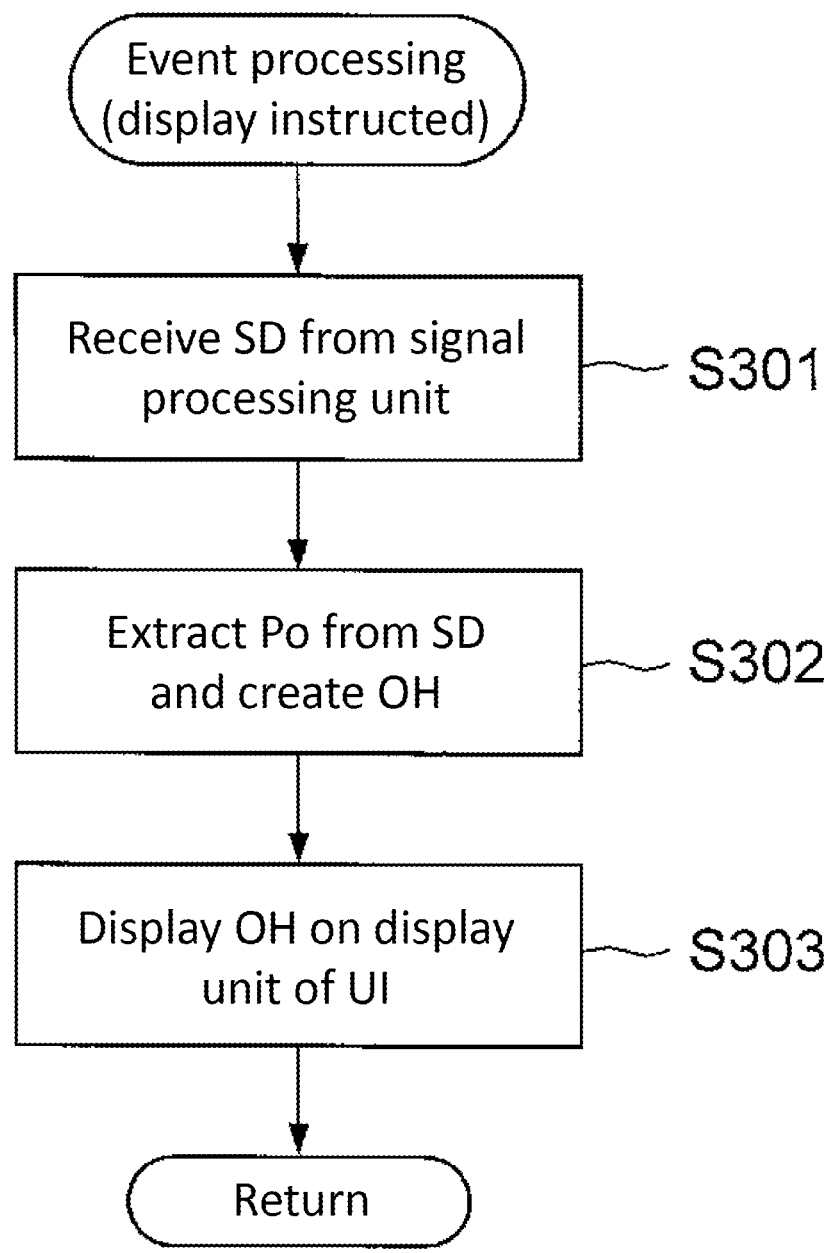
FIG. 12 is a flowchart showing a variation of operations performed by the processing apparatus shown in FIG. 9.

FIG. 12 shows a flowchart of event processing executed by the control unit 111 in the fourth embodiment (or the third embodiment) in the case where a user operation instructing display of an onset histogram has been detected.

First, the control unit 111 receives, from the signal processing unit 115, sample values in sections targeted for onset histogram creation from among sample values SD obtained from the ADC 114 by the signal processing unit 115 (step S301). For example, the time series of the samples SD (or the peaks of each time frame) of the audio signal in a specified time range is received from the recorder of the signal processing unit 115 (or the recording unit 433). Next, the control unit 111 detects a series of onset peaks Po based on the received time series of the samples SD (or peaks), and creates an onset histogram OH corresponding to the detected onset peaks Po (step S302). Next, the control unit 111 displays the onset histogram OH on the display unit of the UI unit 112 (step S303). Then, this event processing is terminated. Some or all of the processing performed by the generating unit 4 may similarly be executed by the control unit 111 in the first and second embodiment.

The first to fourth embodiments of the present invention were described above, but there are other possible embodiments of the present invention. Other embodiments include the following.

(1) In the above-described embodiments, the audio signal, which is the processing target, may be an audio signal of a performance sound of one musical instrument, and may be an audio signal obtained by mixing performance sounds of a plurality of the same or different musical instruments.

(2) The onsets used in onset peak detection may be obtained from an external device by the processing apparatus 100. For example, if it is possible to obtain a time series of MIDI data in which the audio signal and timings are aligned, such as a performance sound performed by a MIDI instrument based on MIDI data, the timing of a note-on event included in the time series of the MIDI data can be used to detect an onset peak as an onset timing.

(3) Some or all of the onset histogram generating unit 4 may be used in common with a processing unit other than the generating unit 4 that is installed in the processing apparatus 100 under management by the control unit 111. For example, an audio signal dynamics processing unit such as a compressor often includes an envelope follower, and in that case, the envelope follower may be used as the envelope follower of the generating unit 4 in the above-described second embodiment.

| List of Reference Numerals | |
|---|---|
| 100, 110 | Audio signal processing apparatus |
| 101 | Microphone |
| 102 | Powered speaker |
| 103 | Multi-track recorder |
| 111 | Control unit |
| 112 | UI unit |
| 113 | Storage unit |
| 1, 114 | ADC |
| 2, 115 | Signal processing unit |
| 3, 116 | DAC |
| 4, 41, 42, 43, 44 | Onset histogram generating unit |
| 5 | Display unit |
| 6 | Parameter estimation unit |
| 7 | Input unit |
| 411 | Rectification unit |
| 412 | Antilogarithm/logarithm conversion unit |

-continued

| List of Reference Numerals | |
|---|---|
| 413, 432 | Peak detection unit |
| 414, 434 | Onset peak detection unit |
| 415, 423, 435, 443 | Frequency counting unit |
| 421, 431 | Pre-processing unit |
| 422 | Latch |
| 424 | Subtraction unit |
| 425 | Multiplication unit |
| 426 | Addition unit |
| 427 | Delay unit |
| 428 | Comparison unit |
| 429 | Time constant unit |
| 433 | Recording unit |
| 436, 444 | Detection range specifying unit |
| 437, 445 | Detection condition specifying unit |
| 441 | Readout unit |
| 442 | Onset processing unit |

The invention claimed is:

1. An audio signal processing method comprising:
obtaining an audio signal having (i) an onset, which is a rising point of a waveform of a musical note included in the audio signal, (ii) an onset peak, which is a maximum level of the waveform of the musical note, (iii) an attack section, which is a first portion of the waveform of the musical note from the onset to the onset peak, and (iv) a non-attack section, which is a second portion of the waveform of the musical note occurring after the onset peak;
detecting one or more level values in each of a plurality of attack sections included in the audio signal including the plurality of attack sections and a plurality of non-attack sections different from the plurality of attack sections; and
generating a histogram of the detected level values in each of the plurality of attack sections, the generated histogram excluding level values of the plurality of non-attack sections.

2. The processing method according to claim 1,
wherein the detecting includes detecting one level value in each of the plurality of attack sections from peaks in respective frames detected from the audio signal.

3. The processing method according to claim 1,
wherein the detecting includes detecting a plurality of level values in each of the plurality of attack sections based on an envelope detected from the audio signal.

4. The processing method according to claim 1,
wherein the detecting includes detecting one level value in each of the plurality of attack sections based on an envelope detected from the audio signal.

5. The processing method according to claim 1, further comprising:
displaying the generated histogram on a display device; and
adjusting a parameter for audio signal processing in response to a user operation received after the generated histogram is displayed on the display device.

6. The processing method according to claim 1, further comprising:
automatically adjusting a parameter for audio signal processing based on the generated histogram.

7. The processing method according to claim 1, further comprising:
receiving a user specification of a time section,
wherein the histogram is generated for a portion of the audio signal in the user-specified time section.

8. The processing method according to claim 1, further comprising:
moving a window of a predetermined time length along a time axis,
wherein the histogram is generated for a portion of the audio signal that enters the moving window.

9. The processing method according to claim 2, further comprising:
displaying the generated histogram on a display device; and
adjusting a parameter for audio signal processing in response to a user operation received after the generated histogram is displayed on the display device.

10. The processing method according to claim 2, further comprising:
automatically adjusting a parameter for audio signal processing based on the generated histogram.

11. The processing method according to claim 2, further comprising:
receiving a user specification of a time section,
wherein the histogram is generated for a portion of the audio signal in the user-specified time section.

12. The processing method according to claim 2, further comprising:
moving a window of a predetermined time length along a time axis,
wherein the histogram is generated based on a portion of the audio signal that enters the moving window.

13. The processing method according to claim 3, further comprising:
displaying the generated histogram on a display device; and
adjusting a parameter for audio signal processing in response to a user operation received after the generated histogram is displayed on the display device.

14. The processing method according to claim 3, further comprising:
automatically adjusting a parameter for audio signal processing based on the generated histogram.

15. The processing method according to claim 3, further comprising:
receiving a user specification of a time section,
wherein the histogram is generated for a portion of the audio signal in the user-specified time section.

16. The processing method according to claim 3, further comprising:
moving a window of a predetermined time length along a time axis,
wherein generating the histogram is generated based on a portion of the audio signal that enters the moving window.

17. The processing method according to claim 4, further comprising:
displaying the generated histogram on a display device; and
adjusting a parameter for audio signal processing in response to a user operation received after the generated histogram is displayed on the display device.

18. The processing method according to claim 4, further comprising:
automatically adjusting a parameter for audio signal processing based on the generated histogram.

19. An audio signal processing apparatus comprising:
a control circuit configured to:
obtain an audio signal having (i) an onset, which is a rising point of a waveform of a musical note included in the audio signal, (ii) an onset peak, which is a maximum level of the waveform of the musical note, (iii) an attack section, which is a first portion of the waveform of the musical note from the onset to the onset peak, and (iv) a non-attack section, which is a second portion of the waveform of the musical note occurring after the onset peak;

detect one or more level values in each of a plurality of attack sections included in the audio signal including the plurality of attack sections and a plurality of non-attack sections different from the plurality of attack sections; and generate a histogram of the detected level values in each of the plurality of attack sections, the generated histogram excluding level values of the plurality of non-attack sections.

20. A non-transitory computer readable medium storing a program for causing a computer to execute:

obtaining an audio signal having (i) an onset, which is a rising point of a waveform of a musical note included in the audio signal, (ii) an onset peak, which is a maximum level of the waveform of the musical note, (iii) an attack section, which is a first portion of the waveform of the musical note from the onset to the onset peak, and (iv) a non-attack section, which is a second portion of the waveform of the musical note occurring after the onset peak;

detecting one or more level values in each of a plurality of attack sections included in the audio signal including the plurality of attack sections and a plurality of non-attack sections different from the plurality of attack sections; and generating a histogram of the detected level values in each of the plurality of attack sections, the generated histogram excluding level values of the plurality of non-attack sections.

* * * * *